United States Patent [19]

Oritsuki et al.

[11] Patent Number: 4,471,375
[45] Date of Patent: Sep. 11, 1984

[54] PHOTO-SENSOR ARRAY APPARATUS FOR MATRIX OPERATION

[75] Inventors: Ryoji Oritsuki, Mobara; Hiromi Kanai, Chiba, both of Japan

[73] Assignee: Hitachi, Ltd., Tokyo, Japan

[21] Appl. No.: 266,703

[22] Filed: May 26, 1981

[30] Foreign Application Priority Data

Jun. 20, 1980 [JP] Japan .................. 55-82889

[51] Int. Cl.³ ............ H01L 23/48; H01L 29/44
[52] U.S. Cl. .................................. 357/68; 357/24; 357/30; 358/280; 358/285; 358/294; 358/296; 358/300
[58] Field of Search ............ 357/24 LR, 24 M, 68, 357/30; 358/280, 285, 294, 296, 300

[56] References Cited

U.S. PATENT DOCUMENTS 4,209,803 6/1980 Guyot ...................... 358/300

FOREIGN PATENT DOCUMENTS 54-116890 9/1979 Japan ....................... 357/30

OTHER PUBLICATIONS

Yamamoto, H., Matsui, M., Tsukada, T., Eto, Y., Hirai, T., Maruyama, E., "A Contact Type Linear Photodiode Array Using an Amorphous Thin Film", *Japanese Journal of Applied Physics*, vol. 17, Supp. 17-1, pp. 135-140, (1978).

Primary Examiner—Martin H. Edlow
Assistant Examiner—William A. Mintel
Attorney, Agent, or Firm—Charles E. Pfund

[57] ABSTRACT

A photo-sensor array apparatus comprises an elongated photo-semiconductor substrate, a plurality of elongated upper electrodes arranged on the upper surface of the substrate in the direction of elongation which is identical with the longitudinal direction of the substrate, and a plurality of groups of transparent lower electrodes arranged on the lower surface of the substrate. The respective groups of lower electrodes are associated with the respective upper electrodes so as to be driven in a matrix fashion. Opposing ends of adjacent elongated upper electrodes are spaced a predetermined distance in the transverse direction of the substrate.

8 Claims, 9 Drawing Figures

PHOTO-SENSOR ARRAY APPARATUS FOR MATRIX OPERATION

BACKGROUND OF THE INVENTION

This invention relates to a photo-sensor array apparatus, and more particularly to a structure of arrangement of junction electrodes to be formed on a photo-semiconductor.

In recent years, various solid-state facsimile transmission devices incorporating a lens and an IC-based image sensor such as MOS or CCD in combination have been developed for practical applications with a view to improving the operational speed and reliability of the facsimile.

These devices are designed to operate on a common principle that the image of an original for transmission is focussed by a lens to form a reduced image on an image sensor. Consequently, the length of a light path is large and the size of the device is proportionately large, and the installation of the lens and the sensor requires high accuracy. The devices, thus, have disadvantages from the mechanical point of view. To be specific, as illustrated in FIG. 1, an original 2 for transmission is illuminated by a light source 1 such as a fluorescent lamp during main and sub-scannings and the beams of light reflected on the original are focussed by a lens 3 to form a reduced image on the image sensor surface of an IC sensor 4 and this reduced image is subjected to photoelectric conversion. When the size of the original 2 is about 220 mm and that of the sensor 20 mm, for example, the reduction ratio is 1/10. When the lens 3 in use has a focal length of 50 mm, the path of light from the original 2 to the IC sensor 4 measures about 600 mm in length. Thus, the device as a whole has a fairly large size. If, in the optical system just mentioned, the focal length is assumed to be 50 mm and the reduction ratio to be 1/10, then the depth of focus is small. This makes inevitable the provision of an adjusting mechanism which can aid in settling the IC sensor 4 in the device with high accuracy. It is further necessary to secure uniform distribution of light and uniform resolution on the entire surface of the original 2. Use of the lens 3, however, entails a disadvantage that such uniformity is degraded in the peripheral area of the image as compared with the central area under the influences of the COS[4] law and the aberration. Since the IC sensor 4 is integrated to high density and, therefore, exhibits very weak sensitivity and very feeble output signals, it needs help of a preamplifier of high performance.

As a remedy against such a disadvantage, there has been proposed an intimate-contact reader type photosensor array apparatus constructed as illustrated, in fragmental section, in FIG. 2 and FIG. 3. In these figures, 5 denotes a light source made of light-emitting diodes, 6 a contact fiber opposing an original 2 for transmission and provided with a light-receiving surface on which the beams of light emitted by the light source 5 and then reflected on the original 2 impinge, 7 a sandwich fiber having embedded therein a bundle of optical fibers not shown in FIG. 3 but described in detail later, 8 a bundle of fibers embedded at prescribed positions in the contact fiber 6 and the sandwich fiber 7, 9 transparent NESA electrodes deposited on the upper surface of the sandwich fiber 7, and 10 lower electrodes made of Cr-Au alloy and deposited on the NESA electrodes 9. These lower electrodes also function as leads for wiring. By 11 is denoted a photoelectric conversion film formed across the sandwich fiber 7, the NESA electrodes 9 and the lower electrodes 10. This photoelectric conversion film 11 is formed of a Se-As-Te type amorphous thin film which is utilized as a target film in the image pickup tube called SATICON (tradename). Denoted by 12 is an upper electrode for supplying prescribed voltage to the photoelectric conversion film 11.

In the photosensor array apparatus constructed as described above, light L emitted from the light source 5 is reflected on the read surface of the original 2 for transmission to give rise to a light signal L', which is passed through a bundle 8 of optical fibers embedded in the fibers 6, 7 and led to the photo-electric conversion film 11 at which the light signal L' is converted into an electric signal. By a scanning circuits 13 such as illustrated in FIG. 4, the electric signal resulting from the conversion is sequentially subjected to switching scanning and is sequentially transmitted to an output terminal 14.

In this construction, the original 2 for transmission can be brought into nearly intimate contact with part of the image sensor which is, in this example, the bundle 8 of optical fibers.

Consequently, the lens system can be omitted, making it possible to simplify the structure and reduce the size of the device and enhance the image-resolving characteristics. Further compared with the IC sensor, this device provides a large light-receiving area per bit and permits production of a large output signal. Thus, it effectively operates with an ordinary IC without requiring any special high-performance preamplifier. Because it finds no use for the lens system, it requires no precision for the placement of the original for transmission and the sensor system. Thus, the device enjoys enhanced mass-producibility.

In order that the photosensor array apparatus of the construction described above may acquire a high image-resolving capacity, the density of the orignal-reading elements must be increased and sympathetically therewith, the number of electrodes and that of wirings for the electrodes must be increased. When an oblong sensor having a longitudinal span of about 220 mm is to be provided with read elements adapted to read the data at fixed pitches of about ⅛ mm, for example, the apparatus requires about 1700 electrodes and as many wirings. Moreover, these electrodes and wirings are required to be arranged at very small intervals of the order of about 10 microns. These requirements have been responsible for the low yield of production suffered by the device in question.

As a measure for overcoming such a disadvantage, there has been proposed a photosensor array apparatus which, as illustrated in FIG. 5, has upper electrodes $12_1$, $12_2$, ... $12_n$ and groups of transparent lower electrodes $10_0$, $10_1$, ... $10_9$ deposited to a photo-semiconductor 15 and arranged for matrix driving. Specifically, the elongated upper electrode $12_1$, $12_2$, ... and $12_n$ correspond to 1(one)-digit, 10-digit, ... and n-digit, respectively, and a first group of lower electrodes $10_0$, $10_1$, ... $10_9$, a second group of lower electrodes $10_0$, $10_1$, ... $10_9$, ... an n-th group of lower electrodes $10_0$, $10_1$, ... and $10_9$ are associated with the 1(one)-digit upper electrode $12_1$, 10-digit upper electrode $12_2$, ... and n-digit upper electrode $12_n$, respectively. Obviously, under the application of a suitable voltage via diodes connected as shown in FIG. 5, the upper electrodes and the lower electrodes are driven in a matrix drive fashion. For drive of 1728 bits, the FIG. 4 arrangement requires 1728+1=1729 lead wires but with the FIG. 5 arrangement, the number of lead wires can be reduced to 86 (=54+32).

In the photo-sensor array apparatus of the construction of FIG. 5, for detection of light at an overlapped portion of photo-semiconductor 15 between the upper electrodes 12 and the lower electrodes 10 as shown in FIG. 6, it is necessary to arrange the plurality of upper electrodes $12_1, 12_2, \ldots 12_n$ at fixed spacings of about 10 microns on the upper surface of photo-semiconductor 15. When the photo-resist method is adopted for the formation of these upper electrodes $12_1, 12_2, \ldots 12_n$, the semiconductor material is degraded during the step of etching. When the stencil-mask vacuum deposition method is adopted, the deposited material seeps into the small spacings of about 10 microns separating the upper electrodes 12, posing a problem of loss of reliability of the formation of such spacings.

SUMMARY OF THE INVENTION

An object of this invention is to provide a photo-sensor array apparatus having an improved structure of arrangement of a plurality of upper electrodes on photo-sensor semiconductor which can assure, between the upper electrodes, sufficient spacings with reliability.

To Accomplish the above object, according to the present invention, there is provided a photo-sensor array apparatus comprising an elongated photo-semiconductor substrate, a plurality of elongated upper electrodes arranged on the upper surface of the substrate in the direction of elongation which is identical with the longitudinal direction of the substrate, and a plurality of groups of transparent lower electrodes arranged on the lower surface of the substrate, the respective groups of lower electrodes being associated with the respective upper electrodes so as to be driven in a matrix fashion, characterized in that opposing ends of adjacent elongated upper electrodes are spaced a predetermined distance in the transverse direction of the substrate.

DESCRIPTION OF PREFERRED EMBODIMENTS

Figure 1:
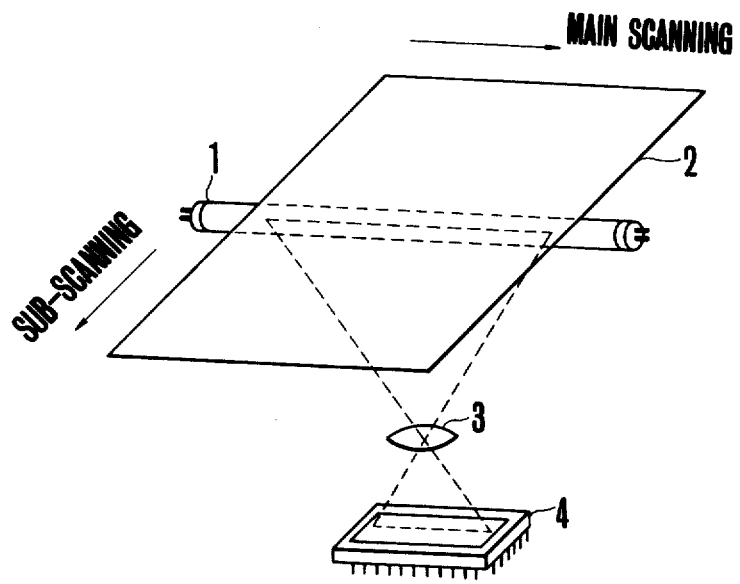
FIG. 1 is a diagrammatic representation showing the schematic overall construction of a conventional photo-sensor array apparatus.
Figure 2:
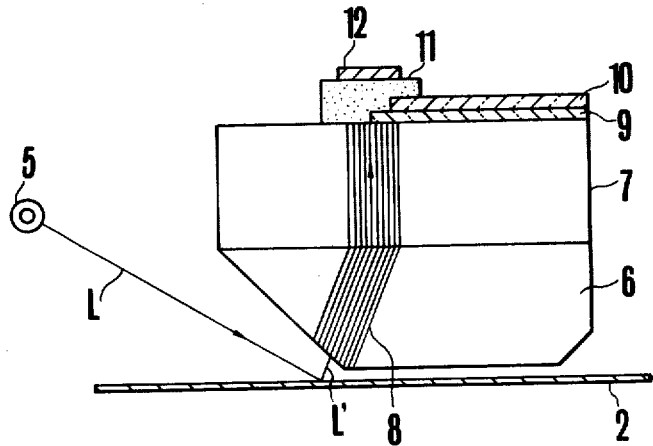
FIGS. 2 and 3 show, in sectional form, advanced conventional photo-sensor array apparatus.
Figure 3:
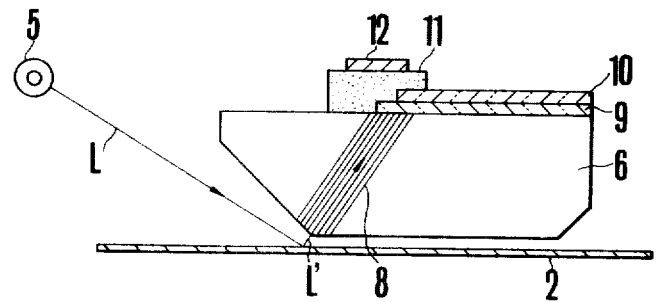
Figure 4:
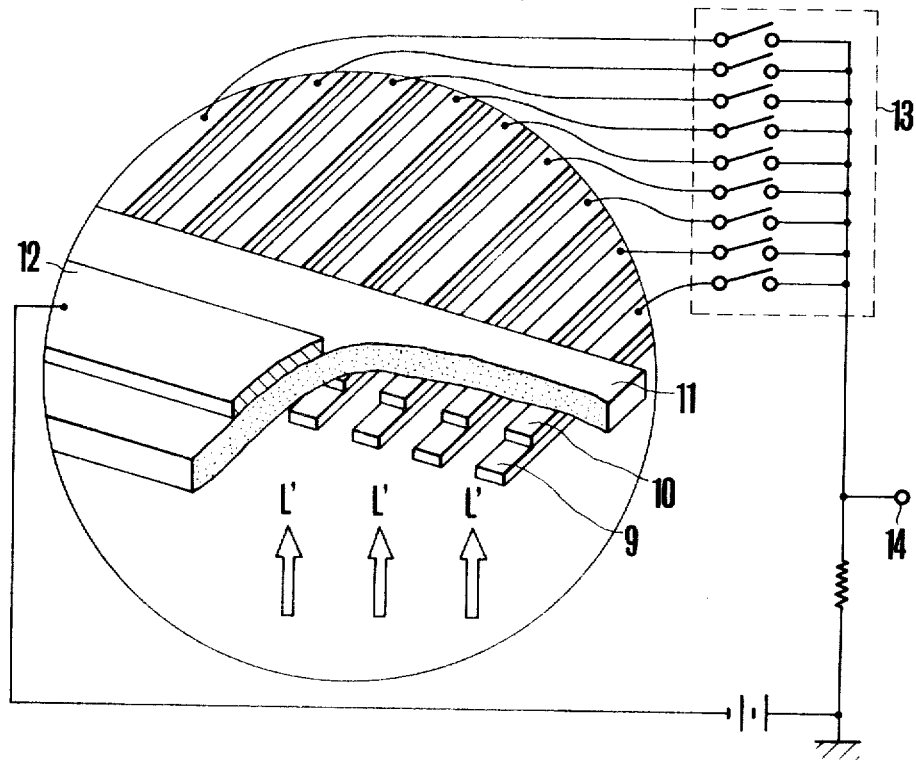
FIG. 4 shows, in partly exploded perspective form, details of a photo-semiconductor substrate and associated electrodes in the apparatus of FIGS. 2 and 3, along with related external wirings.
Figure 5:
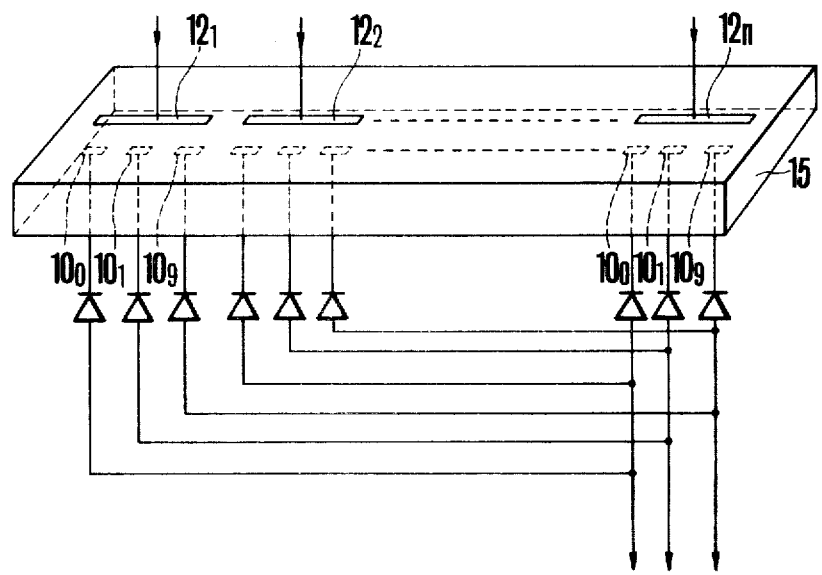
FIG. 5 shows a perspective view of a photo-semiconductor substrate and associated electrodes in a further advanced conventional photo-sensor array apparatus, along with related external wirings.
Figure 6:
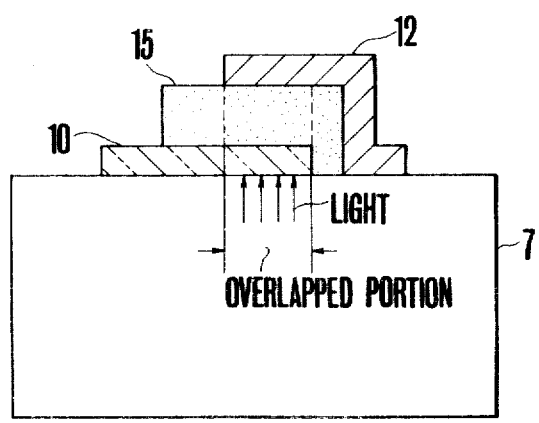
FIG. 6 is a sectional view of FIG. 5.
Figure 7:
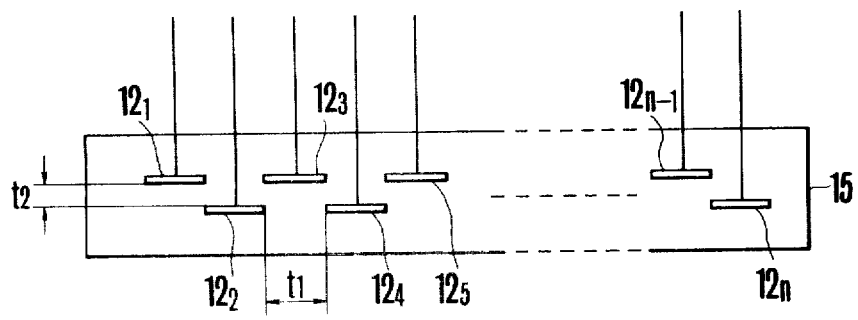
FIGS. 7 to 9 are plan views showing structures of arrangement of upper electrodes in accordance with embodiments of the present invention.
Figure 8:
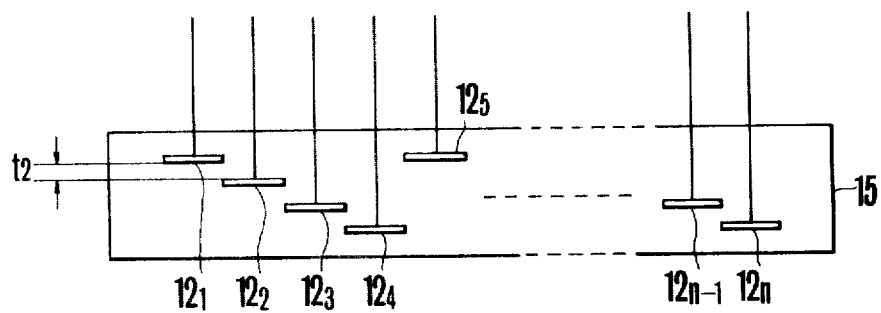
Figure 9:
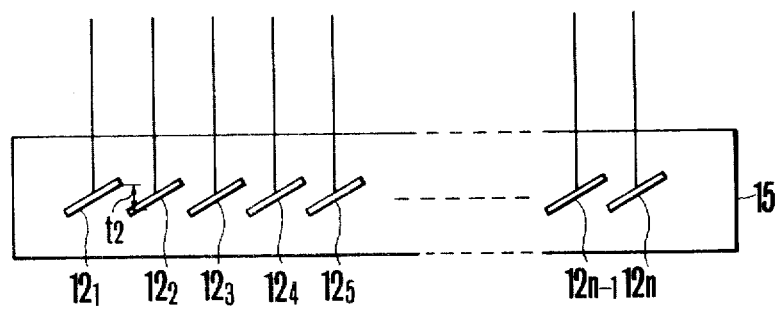

In FIGS. 7 to 9 showing preferred embodiments of the invention, for simplicity of illustration, a photo-semiconductor substrate 15 faced upward is illustrated so that lower electrodes associated with the respective upper electrodes are not seen. As shown in FIG. 7, a plurality of elongated upper electrodes $12_1, 12_2, 12_3, \ldots 12_n$ are arranged in a staggered fashion on the upper surface of the photo-semiconductor substrate 15 in the direction of elongation which is identical with the longitudinal direction of the substrate, with the individual electrodes in each row spaced by a predetermined distance $t_1$ in the longitudinal direction of the photo-semiconductor substrate 15 and the opposing ends of adjacent electrodes in two rows spaced by a predetermined distance $t_2$ measuring greater than 10 microns and less than of equal to 1 millimeter in the transverse direction of the substrate 15. The maximum of this distance $t_2$ is determined in consideration of the line width of a unit character or symbol to be read on the original, and the distance $t_1$ is substantially equal to the length of each of the upper electrodes $12_1, 12_2, \ldots 12_n$.

With this construction, since the upper electrodes $12_1, 12_2, \ldots 12_n$ are sufficiently separated from one another, they can be formed easily by the stencil-mask vacuum deposition method with spacings of high accuracy.

FIG. 8 and FIG. 9 show modified arrangements of the elongated upper electrodes according to the present invention. First with reference to FIG. 8, a plurality of upper electrodes $12_1, 12_2, \ldots 12_n$ are formed on the upper surface of the semiconductor substrate 15 in such a manner that they are regularly offset in an oblique direction relative to both the longitudinal direction and transverse direction of the substrate 15, forming the electrodes arranged in a stairway fashion, and blocks of the plurality of upper electrodes thus arranged are trained in the longitudinal direction.

Now with reference to FIG. 9, a plurality of upper electrodes are formed on the upper surface of the photo-semiconductor substrate 15 in such a manner that each electrode is slanted relative to the longitudinal direction of the photo-semiconductor substrate 15 and the plurality of upper electrodes as a whole are arranged in line in the longitudinal direction of the substrate, thus forming a structure of arrangement of the elongated upper electrodes wherein these electrodes lie on slopings of a saw tooth.

Again in this construction, the upper electrodes are sufficiently separated from one another and, therefore, they can be formed easily by the stencil-mask vacuum deposition method with high accuracy.

Practically, the lower electrodes are formed from a NESA film on the fiber 7 by photoresist method at spacings or pitches of ⅛ mm, a semiconductor material is overlaid on the upper surface of the lower electrodes to form the photo-semiconductor substrate, and the plurality of elongated coplanar upper electrodes are formed, in arrangements as described with reference to FIGS. 7 to 9, on the surface of the photo-semiconductor substrate by vacuum depositing such material as Au with the aid of a stencil mask.

As described above, in the photo-sensor array apparatus according to the present invention, the plurality of upper electrodes can be arranged as separated from one another by spacings of high accuracy. Thus, it has an outstanding effect of enabling read elements to be easily arrayed at pitches of not less than ⅛ mm.

What is claimed is:

1. A photo-sensor array apparatus comprising an elongated photo-semiconductor substrate, a plurality of elongated upper electrodes arranged on the upper surface of said substrate in the direction of elongation which is identical with the longitudinal direction of said substrate, and a plurality of groups of transparent lower electrodes arranged on the lower surface of said substrate, the respective groups of lower electrodes being associated with the respective upper electrodes so as to be driven in a matrix fashion, the improvement wherein opposing ends of adjacent elongated upper electrodes are spaced a predetermined distance in the transverse direction of said substrate said predetermined distance sufficient to provide electrical isolation.

2. A photo-sensor array apparatus according to claim 1 wherein the plurality of elongated upper electrodes are arranged in a staggered fashion.

3. A photo-sensor array apparatus according to claim 1 wherein the plurality of elongated upper electrodes are arranged in a stairway fashion.

4. A photo-sensor array apparatus according to claim 1 wherein the plurality of elongated upper electrodes are arranged to take the form of slopings of a saw tooth.

5. A photo-sensor array apparatus comprising an elongated photo semiconductor substrate, a plurality of elongated upper electrodes arranged on the upper surface of said substrate in the direction of elongation which is identical with the longitudinal direction of said substrate, and a plurality of groups of transparent lower electrodes arranged on the lower surface of said substrate, the respective groups of lower electrodes being associated with the respective upper electrodes so as to be driven in a matrix fashion, the improvement wherein opposing ends of adjacent elongated upper electrodes are spaced apart greater than 10 microns and less than or equal to 1 millimeter in the transverse direction of said substrate.

6. A photo-sensor array apparatus according to claim 5 wherein the plurality of elongated upper electrodes are arranged in a staggered fashion.

7. A photo-sensor array apparatus according to claim 5 wherein the plurality of elongated upper electrodes are arranged in a stairway fashion.

8. A photo-sensor array apparatus according to claim 5 wherein the plurality of elongated upper electrodes are arranged to take the form of slopings of a saw tooth.

* * * * *

UNITED STATES PATENT AND TRADEMARK OFFICE
CERTIFICATE OF CORRECTION

PATENT NO. : 4,471,375
DATED : September 11, 1984
INVENTOR(S) : Ryoji Oritsuki and Hiromi Kanai It is certified that error appears in the above-identified patent and that said Letters Patent is hereby corrected as shown below:

Column 3, line 26, change "Accomplish" to --accomplish--

Column 4, line 9, change "of equal" to --or equal--

Column 4, line 17, after "another," insert
--(i.e., approximately 1 mm but greater than 10 microns to avoid the seepage reliability problem previously described) , --

Signed and Sealed this

Twenty-sixth Day of March 1985

[SEAL]

*Attest:*

DONALD J. QUIGG

*Attesting Officer*   *Acting Commissioner of Patents and Trademarks*